United States Patent [19]

Brody

[11] 4,250,567
[45] Feb. 10, 1981

[54] PHOTOVOLTAIC-FERROELECTRIC BEAM ACCESSED MEMORY

[75] Inventor: Philip S. Brody, Brookmont, Md.

[73] Assignee: The United States of America as represented by the Secretary of the Army, Washington, D.C.

[21] Appl. No.: 50,365

[22] Filed: Jun. 20, 1979

[51] Int. Cl.³ .................. G11C 13/08; G11C 11/22
[52] U.S. Cl. .................................. 365/109; 365/117
[58] Field of Search ............................. 365/109, 117

[56] References Cited

U.S. PATENT DOCUMENTS

| | | | |
|---|---|---|---|
| 3,350,506 | 10/1967 | Chernow | 365/109 |
| 3,435,425 | 3/1969 | Hastings | 365/117 |
| 3,643,233 | 2/1972 | Fan et al. | 365/117 |
| 3,681,765 | 8/1972 | Chapman | 365/109 |
| 3,693,171 | 9/1972 | Asam | 365/117 |
| 3,906,462 | 9/1975 | Feinleib et al. | 365/109 |
| 4,041,477 | 8/1977 | Drenckhan | 365/109 |
| 4,051,465 | 9/1977 | Brody | 365/120 |
| 4,101,975 | 7/1978 | Brody | 365/117 |
| 4,126,901 | 11/1978 | Brody | 365/120 |

OTHER PUBLICATIONS

Oliver et al., An Optical Image Storage and Processing Device Using Electrooptic Zns, IEEE Trans. on Electron Devices, 9/71, vol. ED-18, No. 9, pp. 769–774.

Primary Examiner—Stuart N. Hecker
Attorney, Agent, or Firm—Nathan Edelberg; Robert P. Gibson; Saul Elbaum

[57] ABSTRACT

A three dimensional memory which is comprised of a plurality of stacked memory planes, each of which includes at least a continuous transparent photovoltaic-ferroelectric layer sandwiched between two continuous plane transparent electrodes. In one embodiment, the memory planes are comprised of only the photovoltaic-ferroelectric layer sandwiched between the two electrodes, and in another embodiment the ferroelectric layer and a continuous transparent photoconductive layer are sandwiched between the two electrodes.

15 Claims, 6 Drawing Figures

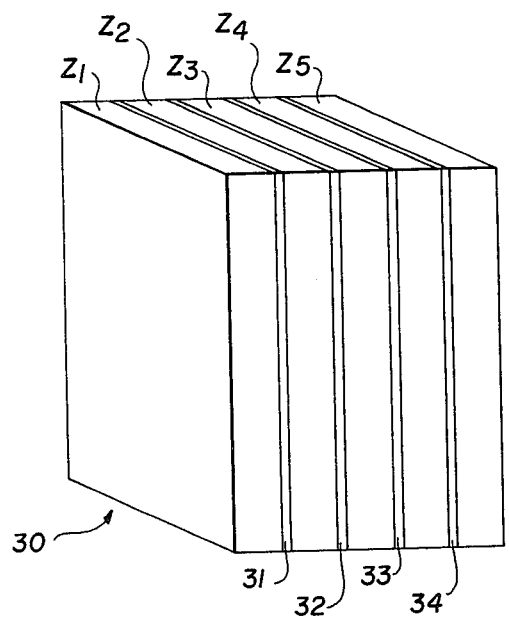
FIG. 3
FIG. 6
FIG. 4
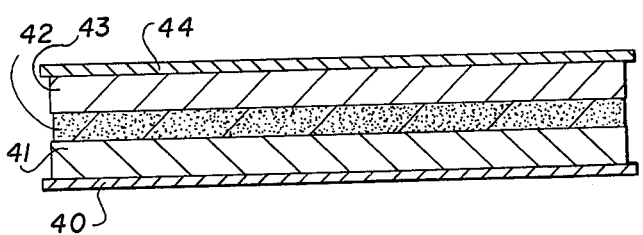
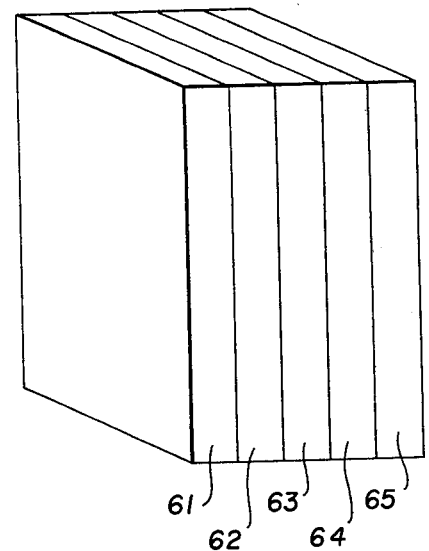
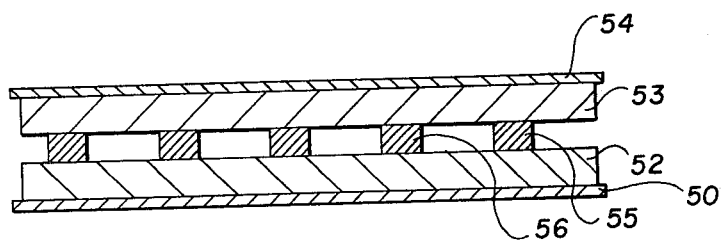
FIG. 5

PHOTOVOLTAIC-FERROELECTRIC BEAM ACCESSED MEMORY

RIGHTS OF THE GOVERNMENT

The invention described herein may be manufactured, used, and licensed by or for the United States Government for governmental purposes without the payment to me of any royalty thereon.

The present invention is related to the inventions disclosed in U.S. Pat. Nos. 4,101,975 and 4,051,465, both of which are incorporated herein by reference.

U.S. Pat. No. 4,101,975 is directed to a three-dimensional memory which is built up of a plurality of memory planes, each of which is comprised of a photovoltaic-ferroelectric layer and a photoconductive layer sandwiched between two electrodes. The three-dimensional memory block has a matrix of cylindrical cavities penetrating therethrough, and x,y accessing is by a light beam incident on a selected cavity, while z accessing for writing is by an electrical voltage pulse applied to a selected memory plane, and for reading is by connecting the selected plane to a read amplifier.

The present invention is directed to a three-dimensional memory which is also comprised of a plurality of memory planes, but which utilizes continuous undifferentiated layers rather than layers having cylindrical cavities. This provides advantages in fabrication and also permits denser storage of information.

It is therefore an object of the present invention to provide a memory which is relatively easy to fabricate.

It is a further object of the invention to provide a memory which allows dense storage of information, and which has a large storage capacity.

It is still a further object of the invention to provide a memory which is well suited for use with single crystal type photovoltaic-ferroelectric material.

The above objects are achieved by providing a three-dimensional memory which is built up of a plurality of memory planes, each of which is comprised of a plurality of continuous, undifferentiated layers. In one embodiment, each of the memory planes is comprised of a photovoltaic-ferroelectric layer and a photoconductive layer sandwiched between two electrodes and in another embodiment each of the memory planes is comprised of only a photovoltaic-ferroelectric layer sandwiched between two electrodes. Read out of the information stored in the memory is by either the photovoltaic effect, the pyroelectric effect, the space charge redistribution effect, or a combination of all three.

The invention will be better understood by referring to the accompanying drawings in which:

FIG. 3 shows an embodiment of a three-dimensional memory according to the invention having transparent insulating layers between the memory planes.

FIG. 4 is a cross-sectional view of a photovoltaic-ferroelectric layer/photoconductive layer sandwich having an optically homogeneous non-continuous film between the ferroelectric layer and the photoconductive layer.

FIG. 5 is a cross-sectional view of a photovoltaic-ferroelectric layer/photoconductive layer sandwich having an array of discrete contacts between the ferroelectric layer and the photoconductive layer.

FIG. 6 shows an embodiment of a three-dimensional memory according to the invention in which each memory plane is comprised of only a photovoltaic-ferroelectric layer sandwiched between two electrodes.

Figure 1:
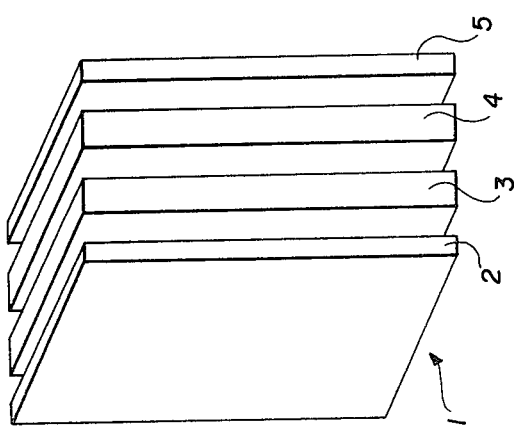
FIG. 1 is an exploded view in perspective of a photovoltaic-ferroelectric layer/photoconductive layer sandwich.

As mentioned above the invention is directed to a three-dimensional memory which is comprised of a plurality of stacked transparent memory planes, each of which utilizes a ferroelectric layer. FIG. 1 is an illustration of one embodiment of a single memory plane from which the three-dimensional memory block may be built.

In FIG. 1, memory plane 1 is comprised of transparent photovoltaic-ferroelectric material layer 4 and transparent photoconductive material layer 3 sandwiched between transparent electrodes 2 and 5. A suitable photovoltaic-ferroelectric material is PLZT or $BaTiO_3$ crystal, and a suitable photoconductive material is $SrTiO_3$ crystal plate. Other suitable materials will be apparent to those skilled in the art, and possibilities are referenced in the above-mentioned patents.

Figure 2:
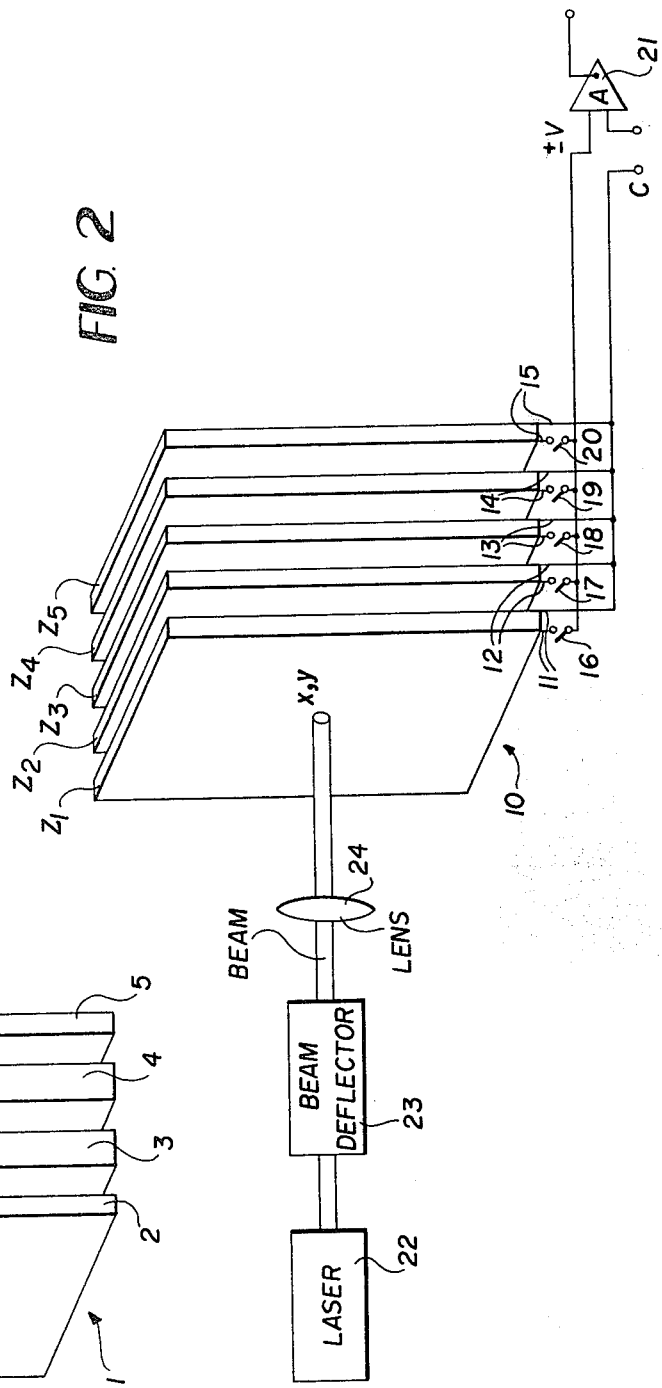
FIG. 2 is an exploded view in perspective of an embodiment of a three-dimensional memory according to the invention.

FIG. 2 is a drawing of an embodiment of the three-dimensional memory of the invention which is comprised of a plurality of stacked memory planes such as memory plane 1 shown in FIG. 1. In FIG. 2 the respective memory planes are denoted $z_1-z_5$, and of course the number of stacked planes used is arbitrary and is not limited by the Figure.

Information is written into the memory by illuminating a beam point x,y on the surface of memory plane $z_1$, and simultaneously applying a voltage pulse plus a $\pm V$ across a selected plane. The light beam is provided by a laser 22, and a beam deflection means 23 for deflecting the beam to a selected x,y position as well as a lens 24 for focusing are also provided. The pulse $\pm V$ is provided by a voltage source and by a switching network which is illustratively shown in the Figure as switches 16–20. In an actual embodiment, these would preferably be a solid state switching network and not discrete switches as shown.

In order to read information from the memory, the selected read point is illuminated with the laser beam and the appropriate memory plane is connected to read amplifier 21. The laser beam illumination provides both a photovoltaic output having the same sign as the applied polarization-inducing pulse and a pyroelectric output also having the same sign as the applied polarization-inducing pulse, due to heating of the ferroelectric material by the laser beam. The proportion of the output signal which is due to the photovoltaic and pyroelectric effects respectively varies with the specific ferroelectric material used, but in general the photovoltaic output predominates and is the more useful of the two. Specific materials having large pyroelectric outputs may be selected in which case the pyroelectric output would be useful.

Read out could also be by way of the space charge redistribution effect in which case the output pulse would have a sign opposite to the sign of the polarization-inducing pulse. When the ferroelectric material is initially polarized, a charge is built up on the ferroelectric layer-photoconductive layer interface, and when the laser beam is incident on the photoconductive layer, this charge is read out as a pulse. In general, the preferable read out mode for the present invention is the photovoltaic mode, although any one of the three modes discussed above or any combination thereof can be utilized.

The advantages of the present invention in comparison to the memory disclosed in U.S. Pat. No. 4,101,975, may now be appreciated. Thus, because the memory of the present invention does not have cylindrical cavities, it is easier to fabricate. Further, in a memory having cavities, the storage density is limited by the number of cavities which can be produced in a given area; in the present memory the storage density is limited only by the size of the light beam, and as known, beams can be focused to very fine points, thus making the effective limitation on storage density the wave length of the light utilized.

Further, while the switching arrangement shown in FIG. 2 allows information to be entered or retrieved in sequential fashion, it should be noted that a different arrangement which allows parallel inputs and outputs and has each sandwich connected to a separate write generator and read amplifier may be used. Further, the memory planes shown in FIG. 2 may be separated by additional single layers of an insulating low dielectric constant transparent materials for additional electrical isolation between the sandwiches, and such an arrangement is shown in FIG. 3 where insulating layers 31–34 separate the memory planes from each other.

In either the arrangement shown in FIG. 2 or in FIG. 3, the optical beam penetrates the successive stacked layers. It can be focused with a lens as shown in FIG. 2 with the total stacked thickness being arranged to be less than the depth of focus of the light bundle, or an arrangement utilizing a thin parallel ray beam can be employed. There is attenuation due to absorbtion and reflection as the beam penetrates the sandwich stack, and this affects the magnitude of the read output signals and can also affect the magnitude of the write signals of one memory plane relative to the other. It does not, however, affect the polarity of the remanent polarization which is written into the memory planes or the polarity of the read photovoltaic or other output signals, so that information which is written in as a given polarity of remanent polarization is uniquely stored and read out as such. Additionally, the introduction of information as remanent polarization at a point x,y in a sandwich $z_i$ does not significantly affect the transparency of the sandwich at that point and so does not affect the intensity of a light beam incident on a plane $z_j$ behind $z_i$.

Gray scale information can be stored by modulating the beam during writing, and images and other patterns can also be introduced simultaneously within a memory plane and then read out point by point as a varying electric signal using a beam. If desired, by varying the amplifier gains, output levels can be normalized to compensate for write and read variations due to attenuation of the beam in the memory block.

It may be necessary for certain applications and for certain materials to include non-continuous conducting regions between the photoconductive layer and the ferroelectric layer for the purpose of improving electrical contact and to minimize the space charge redistribution effect. A spatially homogeneous non-continuous conducting film can be used or discrete contact areas can be employed where storage of information is confined to the electroded area. FIG. 4 shows a sandwich in which non-continuous film 42 is disposed between photoconductive layer 41 and ferroelectric layer 43. FIG. 5 shows a sandwich in which discrete electrodes such as 55 and 56 are disposed between photoconductive layer 52 and ferroelectric layer 53.

For some applications, for instance when optical write-in is not desired, the photoconductive layer may be completely eliminated so that each memory plane is comprised only of two transparent conductors sandwiching a photovoltaic-ferroelectric ceramic layer. Such a structure is shown in FIG. 6 wherein each of planes 61 to 65 is comprised of a photovoltaic-ferroelectric layer between two electrodes.

Such a device could be utilized as a PROM (programmable read only memory) where the programming is done by direct application of electrical voltages as the device is fabricated. Thus the programming could be accomplished either by (1) applying the electric field directly or through temporary electrodes before the continuous electrodes are applied or (2) by using heat (for example a focused laser beam) to de-polarize a uniformly polarized sheet. In each of the cases above the programming is accomplished plane by plane before assembly of the memory block.

It is also possible to use heat (for instance a focused laser beam) to preferentially polarize the regions which are heated for a given applied field. This technique works by raising local temperature at the heated points closer to the curie temperature. This could be accomplished with an assembled memory block by entering information to a point x,y with a focused beam and simultaneously applying a pulse across the sandwiching electrodes of the selected plane. Such an arrangement would have utility for read/write RAM (random access memory) applications as well as PROM applications. A variant of the last-mentioned preferential polarization technique utilizes the band gap light induced excess carriers from the illumination to create the preferential polarization phenomenon rather than the heat produced by the light beam.

The three-dimensional stacked configuration disclosed in the present application may also be used for correlation applications, and the reader is referred to U.S. Pat. No. 4,126,901, which is incorporated herein by reference, for disclosure of how an analogous two-dimensional structure is so utilized. In the three-dimensional device, the output is the current which is generated when an image is convolved with any one of a group of images stored within planes, with any group of such images, or with all of such images. The output is the intregal of the product of the stored and convolved images.

I wish it to be understood that I do not desire to be limited to the exact details of contruction shown and described, for obvious modifications can be made by a person skilled in the art.

I claim:

1. A three-dimensional memory which is comprised of a plurality of stacked memory planes, each memory plane comprising at least a continuous transparent photovoltaic-ferroelectric layer sandwiched between two continuous plane transparent electrodes.

2. The memory of claim 1 wherein each memory plane comprises only a continuous transparent photovoltaic-ferroelectric layer sandwiched between two continuous plane transparent electrodes.

3. The memory of claim 2 wherein said memory is of the programmable read only memory type and the programming is effected by the application of electric fields to the separate ferroelectric layers before the electrodes are applied thereto.

4. The memory of claim 2 wherein said memory is of the programmable read only memory type and the programming is effected by using heat to selectively depolarize uniformly polarized ferroelectric layers before assembly of the memory.

5. The memory of claim 2 wherein the memory is programmed by applying a uniform electrical field to selected memory planes and using heat or light to preferentially polarize selected areas of said planes.

6. The memory of claim 1 wherein each memory plane comprises a continuous transparent photovoltaic-ferroelectric layer and a continuous transparent photoconductive layer sandwiched between two continuous plane transparent electrodes.

7. The memory of claim 6 further including layers of insulating low dielectric constant material disposed between adjacent memory planes.

8. The memory of claim 6 further including a non-continuous conducting film disposed between the ferroelectric and photoconductive layers of each memory plane.

9. The memory of claim 6 further including discrete conducting contact areas disposed between the ferroelectric and photoconductive layers of each memory plane.

10. The memory of claim 6 in combination with means for writing information into said memory, said means comprising, means for providing a light beam, means for deflecting the beam to selected x,y positions on said memory planes, voltage source means, and switch means for applying the voltage produced by said voltage source means across the electrodes of a selected memory plane, whereby information is written into said selected x,y positions on said selected memory plane.

11. The combination of claim 10 further including read amplifier means, said switch means further being operative to connect a selected memory plane to said read amplifier means.

12. The combination of claim 11 wherein a photovoltaic read output is utilized.

13. The combination of claim 11 wherein a pyroelectric read output is utilized.

14. The combination of claim 11 wherein a space charge redistribution read output is utilized.

15. A three-dimensional photovoltaic-ferroelectric correlation device comprising, a three-dimensional block comprised of a plurality of stacked planes, each plane comprising a continuous transparent photovoltaic-ferroelectric layer and a continuous transparent photoconductive layer sandwiched between two continuous plane transparent electrodes, means for applying the same or different spatially varying voltage patterns to the photovoltaic-ferroelectric layers of different ones of said planes to induce respective remanent polarization patterns therein which correspond to the respective voltage patterns, said means for applying said voltage patterns including voltage source means, illumination means for producing storage optical patterns which correspond to said voltage patterns, and the photoconductive layers of the respective memory planes, means for illuminating said remanently polarized layers with a desired illumination pattern having spatial variations in intensity, means for collecting the photocurrent induced at each point on the surface of each of said respective photovoltaic-ferroelectric layers, which photocurrent is proportional to both the remanent polarization of the particular ferroelectric layer and the intensity of the illumination of said desired pattern on the layer, and means for each ferroelectric layer for providing an indication of the total current induced, while indication corresponds to the correlation of said one of said storage patterns and said desired pattern.

* * * * *